United States Patent [19]

Lindeman et al.

[11] Patent Number: 4,992,053
[45] Date of Patent: Feb. 12, 1991

[54] ELECTRICAL CONNECTORS

[75] Inventors: Richard J. Lindeman, Wood Dale; Saeed U. Zafar, Park Ridge, both of Ill.

[73] Assignee: Labinal Components and Systems, Inc., Elk Grove Village, Ill.

[21] Appl. No.: 375,588

[22] Filed: Jul. 5, 1989

[51] Int. Cl.⁵ .............................................. H01R 9/09
[52] U.S. Cl. .......................................... 439/66; 439/91
[58] Field of Search ......................... 439/66, 71, 74, 75, 439/91, 591, 592, 65, 68, 69, 92, 817, 247

[56] References Cited

U.S. PATENT DOCUMENTS

| | | | |
|---|---|---|---|
| 2,853,656 | 9/1958 | Dowds | 439/66 X |
| 3,077,511 | 2/1963 | Bohrer et al. | 439/69 X |
| 3,200,297 | 8/1965 | Gibson | 439/83 X |
| 3,616,532 | 11/1971 | Beck | 439/83 X |
| 3,795,037 | 3/1974 | Luttmer | 439/591 X |
| 3,795,047 | 3/1974 | Abolafia et al. | 174/262 X |
| 3,862,790 | 1/1975 | Davies et al. | 439/66 |
| 3,904,934 | 9/1975 | Martin | 439/66 X |
| 4,029,375 | 6/1977 | Gabrielian | 439/66 |
| 4,257,661 | 3/1981 | Dalamangas et al. | 439/66 X |
| 4,574,331 | 3/1986 | Smolley | 439/74 X |
| 4,581,679 | 4/1986 | Smolley | 439/66 X |
| 4,636,018 | 1/1987 | Stillie | 439/91 X |
| 4,733,172 | 3/1988 | Smolley | 324/158 P |

OTHER PUBLICATIONS

IBM Technical Disclosure Bulletin, vol. 22, No. 1, 1979; pp. 158, 159.

Primary Examiner—Neil Abrams
Assistant Examiner—Khiem Nguyen
Attorney, Agent, or Firm—Neuman, Williams, Anderson & Olson

[57] ABSTRACT

An electrical connector is disclosed including two complementary insulating members which form a block of substantial thickness, with openings therethrough, elongated conductive slugs in the openings and resilient wadded conductor buttons retained at and contacting each end of each slug and each having a resiliently compressive portion protruding from the block for axial compressive electrically conductive connection to an adjacent component such a circuit board, for connecting components which are to be spaced apart by a substantial dimension.

16 Claims, 1 Drawing Sheet

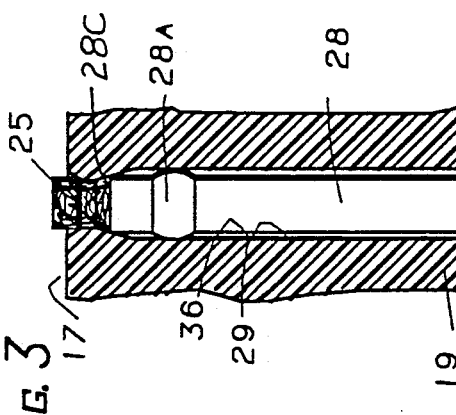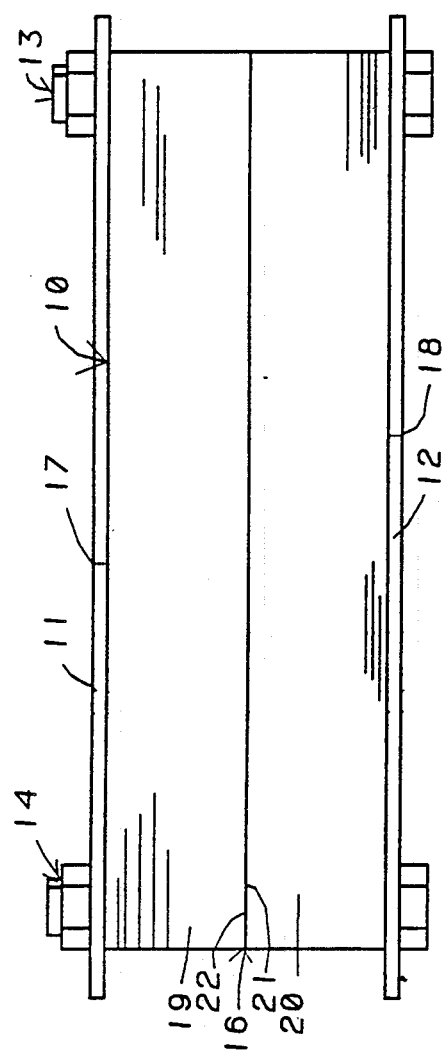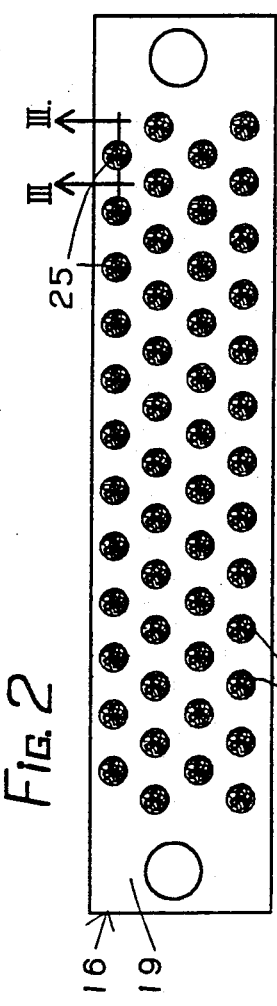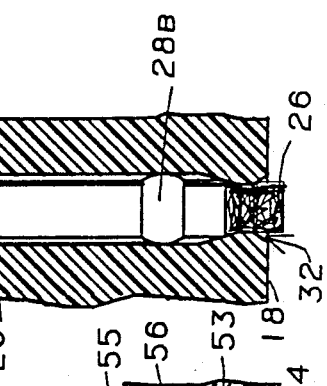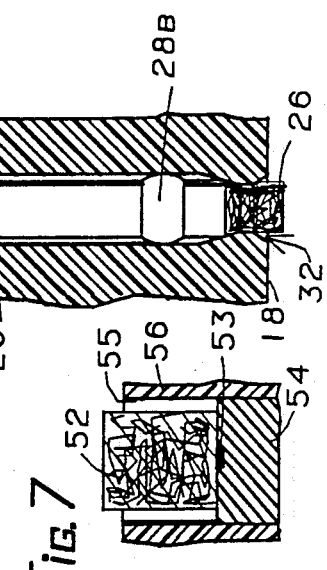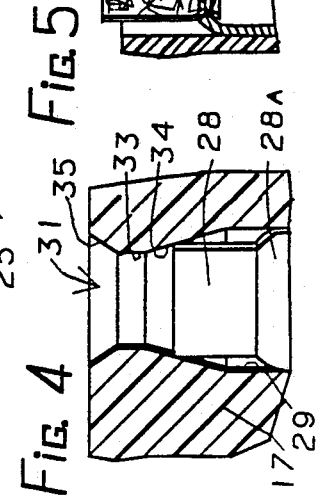

ELECTRICAL CONNECTORS

REFERENCE TO RELATED APPLICATION

This application relates to subject matter which is disclosed in the copending application of Albert Nicholas Hopfer, III and Richard Jay Lindeman, Serial No. 07/352,499, filed May 16, 1989. The disclosure of said application is incorporated by reference.

BACKGROUND OF THE INVENTION

1. Field of the Invention

This invention relates to electrical connectors and more particularly to electrical connectors which are usable for installation between circuit boards or other components for propagation of high frequency signals. The connectors of the invention are readily installed and are highly efficient and reliable while being readily and economically manufacturable.

2. Background of the Prior Art

Many different types of electrical connectors have heretofore been used or proposed in the prior art, including electrical connectors which utilize wadded conductor contacts or "buttons" which generally include "wads" of fine wire which are placed in holes in a carrier of insulating material in position to be compressed between the surfaces of a pair of conductors to be connected. Such conductive wads or buttons are advantageous in that they have very low resistance to current and also in that they have very low inductance and are otherwise highly suitable for propagation of very high frequency signals.

However, arrangements of the prior art, including those using such buttons, have not been entirely satisfactory, especially for connecting circuit boards or other components which are separated by substantial dimensions.

SUMMARY OF THE INVENTION

This invention was evolved with the general object of improving upon the prior art and more particularly for providing connectors which can be readily used for connecting separated circuit boards or other components, while being efficient and reliable and manufacturable at reasonably low cost.

In a connector constructed in accordance with the invention, a plurality of elongated slugs of conductive material are positioned in openings in a block of insulating material with opposite terminal ends of the slugs being spaced inwardly from opposite surfaces of the block to define cavities in which the resilient wadded conductor contact elements or buttons are retained. The buttons are compressible between terminal end surfaces of the slugs and the surfaces of conductors placed in alignment with the cavities and pressed toward the opposite surfaces of the block. Such conductors may be conductors of printed circuit boards or other components which may be positioned as far apart as may be desirable, to provide space for resistors, capacitors, inductors, transformers or other components which are mounted on and project from either or both sides of a board, for example. The length of the slugs and the corresponding thickness of the block may be varied to accommodate any distance between circuit boards or other components as may be required.

Important features relate to the retention of the buttons in the cavities, while also preserving resilient compressive capabilities for reliable predetermined contact pressures and electrical connection with the respective conductive components. It is found that there are difficulties in attempting to retain the buttons in place through tight fits with cavities which have only cylindrical walls while at the same time obtaining the proper positioning of the slugs and also obtaining the desired electrical characteristics.

An important feature of the invention relates to the provision of internal enlargements in openings of the block to apply localized clamping pressures to the buttons and to provide inner transverse expansion regions with inner ends of the cavities into which inward portions of the buttons expand to resist outward movement of the buttons. The arrangement thus operates to securely retain the buttons in the cavities while also maintaining the desired axial resilient compressibility of the buttons. In place of or in addition to providing the inner expansion regions, the buttons may be retained through direct connections to the terminal ends of the slugs, through crimping, soldering, welding or other connecting operations.

Thus with the invention, the buttons are securely retained so that the connectors may be handled without loss of any buttons and, when the connectors are installed between circuit boards, the desired electrical connections are reliably obtained. The buttons retain the desired ability to compress axially and they operate to insure electrical contact with the respective surfaces of the slugs and circuit board connectors.

A specific feature relates to the formation of the inner expansion regions through the provision of narrowed portions of the cavities spaced outwardly from the terminal ends of the slugs. Another important feature relates to the formation of the block from at least two portions to allow assembly of the slugs in the openings without requiring movement of the slugs through the narrowed portions.

Other objects, features and advantages of the invention will become more fully apparent from the following detailed description taken in conjunction with the accompanying drawings.

BRIEF DESCRIPTION OF THE DRAWINGS

FIG. 1 is a side elevational view showing a connector of the invention installed between a pair of circuit boards;

FIG. 2 is a top plan view of the connector of FIG. 1;

FIG. 3 is a sectional view on an enlarged scale, taken substantially along line III—III of FIG. 2;

FIG. 4 is a sectional view corresponding to an upper portion of FIG. 3, but with a button removed to show the form of cavity surfaces;

FIG. 5 is a sectional view similar to FIG. 4, but showing modification with a button attached to a slug by crimping; and FIGS. 6 and 7 illustrate modifications in which buttons are bonded to a slug, through an adhesive or through a welding or soldering operation.

DESCRIPTION OF PREFERRED EMBODIMENTS

Reference numeral 10 generally designates an electrical connector which is constructed in accordance with the principles of the invention and which is shown installed between two circuit boards 11 and 12 which are compressibly positioned by two bolts 13 and 14. The connector 10 functions to interconnect circuits on the boards 11 and 12 and also functions as a spacer between the boards 11 and 12. One or more additional connectors may be used in connecting and spacing two boards and/or in connecting and spacing three or more circuit boards in stacked relation. The vertical dimensions of the connectors may be selected in accordance with the vertical extent of components on the boards and connectors with different vertical dimensions may be used to connect three or more stacked boards. In each case the connectors of the invention operate to provide signal propagation paths between the boards which have short lengths and which are highly reliable. The connectors of the invention are also readily installed by simply sandwiching the connectors between boards and clamping the boards and connectors together.

The connector 10 includes a block 16 which is of insulating material and which has upper and lower planar surfaces 17 and 18. Block 16 is preferably formed by upper and lower members 19 and 20 respectively having lower and upper surfaces 21 and 22 engaging in a plane which is midway between the surfaces 17 and 18 in the illustrated connector but which may be positioned at unequal distances from the surfaces 17 and 18.

To interconnect conductors of the circuit boards 11 and 12, a series of conductive buttons 25 are mounted in cavities in the upper surface 17 of the block 16 for engagement with the conductive pads on the underside of the circuit board 11 and corresponding series of conductive buttons 26 are mounted in cavities in the lower surface 18 of the block 16 for engagement with the conductive pads on the upperside of the circuit board 18. Each of the buttons may typically be in the form of an elongated cylindrical contact element comprising a resiliently and randomly wadded thin gauge electrically conductive wire. Such buttons provide low impedance connections when proper contact pressures are maintained between such buttons and contact surfaces engaged thereby.

To connect such buttons 25 and 26, a plurality of elongated slugs 28 of copper or other conductive material are provided within the block 16. The mounting of two of such buttons 25 and 26 and the connection thereof by one of such slugs 28 is shown in the sectional view of FIG. 3.

The slug 28 is positioned in an opening in the block 16 which is defined by aligned openings 29 and 30 in the upper and lower members 19 and 20, the slug being so positioned that terminal upper and lower end surfaces thereof are respectively spaced at substantially equal distances below and above the upper and lower surfaces 17 and 18 of the block 16 to provide cavities which receive the buttons 25 and 26 and which are generally designated by reference numerals 31 and 32. Only the cavity 31 at the upper end of the illustrated slug 28 will be described in detail, the cavity at the lower end and other cavities of the connector being of substantially the same form.

The cavity 31 in the upper member 19 has an "hour glass" shape and is defined by surface portions which include an intermediate neck portion 33, an inner flared portion 34 and an outer flared portion 35. The remainder of the opening 29 in the upper member 19 is defined by a right cylindrical surface portion 36 which extends downwardly from the lower end of the lower surface portion 34 of the cavity.

The neck portion 33 has a very small axial dimension and applies a localized compressive pressure to the button 25 when installed to securely hold the button 25 in place while allowing free resilient axial compression of the button 25 to obtain reliable low resistance connections. The inner flared portion 34 provides an expansion region into which a lower portion of the button expands when the button is installed, to additionally insure the secured holding of the button in place while allowing free resilient axial compression thereof. The outer flared portion 35 facilitates installation of the button and avoids entrapment of any protruding fine wire portions of the button between facing surfaces of the connector and circuit board. It also facilitates the free axial compression of the button when installed and accommodates any slight transverse relative shifting movements of the connector and circuit board as may occur during or after assembly. It preferably is of very smooth form, facilitating installation of the buttons and avoiding sharp edges which might catch and cause entrapment of protruding wire portions of the buttons.

In assembling the connector, the members 19 and 20 are moved together while positioning the slugs 28 to enter the openings of the members 19 and 20 at the surfaces 21 and 22 thereof, so that the slugs 28 do not pass through the cavity-defining surfaces. The slugs may preferably be installed with a press fit using fixtures to obtain accurate positioning thereof. Slugs 28 may preferably include collar portions 28A and 28B adjacent the terminal ends thereof, providing localized pressure engagement with the block members 19 and 20. When the slug 28 is installed as shown in FIGS. 3 and 4, its upper terminal end surface, indicated by reference numeral 28C, is positioned below the lower end of the neck portion 35 and its opposite terminal end surface is similarly positioned with respect to the corresponding surface of the cavity 32, thereby providing the aforementioned expansion regions. The block members 19 and 20 may be secured together by any suitable means, such as use of an adhesive at the interface of surfaces 21 and 22. Advantageously, press-fit engagement of the slugs in the openings 29 and 30 may be utilized for effecting such securement of the members 19 and 20 to one another, with the slugs in place, to form the base connector assembly.

After assembly of the block members 19 and 20 and the slugs 28, the buttons 25 and 26 are installed in the cavities 31 and 32. In its initial nominal or unstressed condition, the button 25 may be of generally right cylindrical shape with a diameter substantially less than that of the outer flared portion 35 and only slightly greater than that of the neck portion 33, sufficient to securely hold the button in place while allowing free axial compression thereof to obtain electrically efficient contact pressures. Such contact pressures are provided when the connector 10 is clamped in its operative position between circuit boards, as in FIG. 1 wherein the bolts 13 provide the clamping force, or between other components to be connected. In such assembled combinations, conductive pad areas on the respective spaced components are axially pressed against the exposed distal end surfaces of the buttons 25 and 26 of a respective button-and-slug conductor path and thereby are effectively connected in electrically conductive contact with one another through the connector 10.

FIG. 5 illustrates a modification in which a button 40 is inserted into a hollow end portion of a slug 42 which is positioned in an opening 43 of a block member 44. A terminal end 42A of the slug 42 is crimped inwardly into locking engagement with an inner end portion of the button to securely hold the button 40 while allowing free resilient axial compression of the button to obtain an electrically efficient contact pressure. As shown, the opening 43 has a uniform diameter which is greater than that of the button 40. The block in this case may be formed by the single member 44 with a button affixed through crimping to the opposite end of the slug 42.

In place of the crimping arrangement of FIG. 5, arrangements as shown in FIGS. 6 and 7 may be used, in which a button is bonded to a slug. In FIG. 6, a button 46 is secured through a weld or solder bond, indicated by reference numeral 47, to the end of a slug 49 disposed in an opening 49 in a block member 50. In FIG. 7, a button 52 is secured through an adhesive 53 to the end of a slug 54 disposed in an opening 55 of a block member 56. The adhesive 54 may be in a small centrally located pocket in the surface of the slug, to permit electrical contact between the major portion of the button 52 and the terminal end surface of the plug 54 or the adhesive may be an electrically conductive adhesive.

The surfaces of the slugs 28 may be engaged with or in close proximity to the walls of the openings 29 and 30, or there may be a substantial radial spacing between the surfaces of the slugs 28 and the walls of the openings 29 and 30 such as is provided when using the collars 28A and 28B as shown in FIG. 3. In either case, the relative radial dimensions of the slugs 28 and the walls of the openings 29 and 30 affect the impedance of the conductive paths through the slugs. As a result, one may choose predetermined dimensional values to control the impedance of the connections being effected. Further, shielding may be placed around the connector 10, with or without the use of central ground planes for further providing shielding against EMI and RFI interference and for additional control of the impedance values, along the lines referred to in the aforementioned copending application Ser. No. 07/352,499 and in issued U.S. Pat. Nos. 4,710,133 and 4,806,110.

It will be understood that other modifications and variations may be effected without departing from the spirit and scope of the novel concepts of the invention.

We claim:

1. An electrical connector comprising: a block of insulating material having opposite surfaces in spaced generally parallel planes and having a plurality of spaced parallel openings therethrough extending between and in transverse relation to said opposite surfaces thereof, a plurality of elongated slugs of conductive material positioned in said openings with there being inward spacings between opposite terminal ends of each slug and said opposite surfaces of said block to provide a pair of cavities within each opening at the opposite ends of each of said slugs, a pair of resilient wadded conductor contact elements disposed in each of said pairs of said cavities for engagement with conductive elements placed in alignment with said cavities and pressed against said opposite surfaces of said block, and retaining means operative to allow said resilient wadded conductor contact elements to be securely held in said cavities while allowing free resilient axial compression of said resilient wadded conductor contact elements to develop electrically efficient contact pressures with surfaces of conductors placed in alignment with said cavities and pressed toward said opposite surfaces of said block.

2. An electrical connector as defined in claim 1 wherein said retaining means includes gripping surface means for gripping engagement with portions of said resilient wadded conductor contact elements to hold said resilient wadded conductor contact elements in said cavities.

3. An electrical connector as defined in claim 2 wherein the axial dimension of said gripping surface means is a small fraction of the axial dimension of said resilient wadded conductor contact elements to allow said free resilient axial compression of said resilient wadded conductor contact elements.

4. An electrical connector as defined in claim 2 wherein said gripping surface means are in the form of surface portions of said block extending radially inwardly into pressure engagement with said resilient wadded conductor contact elements upon insertion thereof into said cavities.

5. An electrical connector as defined in claim 4, wherein said block includes at least two portions to allow assembly of said slugs in said openings without movement of said slugs through said openings.

6. An electrical connector as defined in claim 5 wherein said retaining means include inner transverse expansion regions located axially inwardly from said gripping surface means and axially outwardly from said terminal ends of said slugs and so arranged that upon insertion of said resilient wadded conductor contact elements into said cavities inward portions thereof expand transversely into said regions to thereafter resist outward movement of said resilient wadded conductor contact elements.

7. An electrical connector as defined in claim 1 wherein said retaining means include holding means for securing portions of said resilient wadded conductor contact elements to terminal ends of said slugs.

8. An electrical connector as defined in claim 7 wherein said holding means include portions of said slugs crimped into gripping engagement with inward portions of said resilient wadded conductor contact elements to hold said resilient wadded conductor contact elements in said cavities.

9. An electrical connector as defined in claim 1 wherein said retaining means include means for bonding portions of said resilient wadded conductor contact elements at the inner ends thereof to said terminal ends of said slugs.

10. An electrical connector as defined in claim 1, arranged for installation between a pair of circuit boards or the like to effect compression of said resilient wadded conductor contact elements between ends of said slugs and conductive elements on said circuit boards, each slug and associated pair of resilient wadded conductor contact elements thereby providing direct electrical connections between a pair of said conductive elements.

11. An electrical connector as defined in claim 1 wherein said block includes at least two portions formed with aligned openings therethrough to define said openings of said block, said portions being formed with surfaces within said openings therethrough for engagement with said slugs to limit axial movement thereof and to substantially fix the position of said slugs within said block.

12. An electrical connector as defined in claim 1, wherein the outer ends of said cavities have cross-sectional dimensions and configurations at least as large as the nominal relaxed cross-sectional dimensions and configuration of said resilient wadded conductor contact elements to facilitate said free resilient axial compression of said resilient wadded conductor contact elements in developing said equalized and distributed contact pressures and surfaces of conductors placed in alignment with said cavities and pressed toward said opposite surfaces of said block.

13. An electrical connector as defined in claim 12, wherein said outer ends of said cavities are tapered to facilitate insertion of said resilient wadded conductor contact elements therein.

14. An electrical connector comprising: a block of insulating material having opposite surfaces in spaced generally parallel planes and having a plurality of spaced parallel openings therethrough extending between and in transverse relation to said opposite surfaces thereof, a plurality of elongated slugs of conductive material positioned in said openings with there being inward spacings between opposite terminal ends of each slug and said opposite surfaces of said block to provide a pair of cavities within each opening at the opposite ends of each of said slugs, and a pair of resilient wadded conductor contact elements disposed in each of said pairs of said cavities for engagement with conductive elements placed in alignment with said cavities and pressed against said opposite surfaces of said block, the outer ends of said cavities having cross-sectional dimensions and configurations at least as large as the nominal relaxed cross-sectional dimensions and configuration of said resilient wadded conductor contact elements to avoid entrapment of portions of said resilient wadded conductor contact elements during assembly and to facilitate free resilient axial compression of said resilient wadded conductor contact elements in developing equalized and distributed contact pressures and surfaces of conductors placed in alignment with said cavities and pressed toward said opposite surfaces of said block.

15. An electrical connector as defined in claim 14, wherein said outer ends of said cavities are tapered to facilitate insertion of said resilient wadded conductor contact elements therein.

16. A method of assembling circuit boards to obtain electrical connections between conductive elements thereof, comprising the steps of providing a block of insulating material having opposite generally planar surfaces and having a plurality of spaced parallel openings therethrough extending between and in transverse relation to said planar surfaces, providing a plurality of elongated slugs of conductive material positioned in said openings with there being a predetermined inward spacing between each end of each slug and an adjacent one of said generally planar surfaces of said block to provide a pair of cavities at the opposite ends of each of said slugs, installing a pair of resilient wadded conductor contact elements in each pair of said cavities to be securely held in said cavities while being free for resilient axial compression thereof, positioning said block between said circuit boards with said slugs in alignment with the said conductive elements of the boards to be connected, and applying clamping pressure to said boards to effect resilient axial compression of said resilient wadded conductor contact elements into pressure engagement with conductive elements of the boards.

* * * * *